United States Patent [19]
Chen et al.

[11] Patent Number: 5,851,867
[45] Date of Patent: Dec. 22, 1998

[54] RUGGED STACKED OXIDE LAYER STRUCTURE AND METHOD OF FABRICATING SAME

[75] Inventors: Kuang-Chao Chen; Tuby Tu, both of Hsin-chu, Taiwan

[73] Assignee: Mosel Vitellic Incorporated, Hsin-Chu, Taiwan

[21] Appl. No.: 697,623

[22] Filed: Aug. 27, 1996

[51] Int. Cl.⁶ .................. H01L 21/8234; H01L 21/31
[52] U.S. Cl. .................. 438/238; 438/763; 438/790
[58] Field of Search .................. 437/235, 238, 437/919, 243; 438/763, 238, 790

[56] References Cited

U.S. PATENT DOCUMENTS

| | | | |
|---|---|---|---|
| 4,818,337 | 4/1989 | Barnett | 156/659.1 |
| 5,049,517 | 9/1991 | Liu | 437/52 |
| 5,484,749 | 1/1996 | Maeda | 437/238 |
| 5,503,882 | 4/1996 | Dawson | 437/238 |
| 5,545,585 | 8/1996 | Wang | 437/52 |

*Primary Examiner*—John Niebling
*Assistant Examiner*—Michael S. Lebentritt
*Attorney, Agent, or Firm*—Chi Ping Chang

[57] ABSTRACT

The present invention relates to a rugged stacked oxide layer structure which remarkably increases an area of a subsequent deposition layer over the rugged stacked oxide layer. The enlargement of the area of a deposition layer over the rugged oxide layer enables one to ameliorate an electrical characteristic of a device and provide a higher integration density. For example, the rugged stacked oxide layer can be used to provide a higher capacitance by enlarging the area of a storage electrode of a capacitor. Similarly it can also be used to increase light absorption of a photodetector per unit area by enlarging an interfacial area of a P-N junction of the photodetector.

10 Claims, 2 Drawing Sheets

RUGGED STACKED OXIDE LAYER STRUCTURE AND METHOD OF FABRICATING SAME

DESCRIPTION OF THE PRIOR ART

Many significant progresses have recently been made in development of semiconductor memory devices. Especially, various attempts have been made to provide a high integration density for a dynamic random acess memory (to be referred to as a DRAM hereinafter) without decreasing storage characteristics thereof. Each DRAM cell comprises a single field effect transistor and a single memory capacitor C. The field effect transistor has a first conduction terminal connected to a storage electrode of the memory capacitor C and a second conduction terminal connected to a bit line BL. In addition, the field effect transistor has a gate electrode connected to a word line WL. The memory capacitor C has an additional electrode connected to the ground. Many DRAM cells are arranged in a matrix form to store large quantity information. At the time of data writing, since a predetermined potential is applied to the word line WL so that the field effect transistor is rendered conductive, a charge from the bit line BL is stored in the memory capacitor C.

On the other hand, at the time of reading data, since a predetermined pontential is applied to the word line WL so that the field effect transistor is rendered conductive, the charge stored in the memory capacitor is extracted through the bit line BL. Accordingly, information "0" and "1" is represented by an electric charge and no charge (or alternatively, no charge and an electric charge) on the storage electrode of the memory capacitor. During the reading cycle, the memory capacitor C also shares charges with the bit line BL capacitance. The ratio of the two capacitances has to be high enough to ensure that the resulting voltage can be detected by a sense amplifier. Hence, it is expected that the capacitance of a memory capacitor should be raised as much as possible to improve a signal to noise (S/N) ratio of the DRAM cell while maintaining the same occupation area of a memory capacitor and the complexity of fabrication as that of the conventional art.

Mostly the capacitor of a DRAM cell comprises a storage electrode of polysilicon layer, a plate electrodes of polysilicon layer, and a dielectric film of a stacked ONO (Oxide-Nitride-Oxide) layer. Although some studies have shown that thinning the dielectric film can increase the capacitance of a capacitor, a thinner dielectric film is generally less reliable as the number of defects such as pinholes may increase. In addition, the electric field strength applied to the dielectric film will increase to cause a dielectric breakdowns. Therefore, the dielectric film is limited by its thickness. Another method to provide a higher capacitance is to enlarge an area of the storage electrode. However, if the area of a memory capacitor is enlarged, the occupation area of the memory cell will increase concurrently, resulting in a big obstacle in implementation of a highly integrated device with a large memory capacity.

Presently, in order to overcome said problems, a stacked memory capacitor or a trench memory capacitor is often used as a charge storage capacitor of the DRAM cell. For example, a trench memory capacitor is disclosed in U.S. Pat. Nos. 4,859,615 and 5,012,308. By disposing a polysilicon film on a "V" or "U" shaped trench formed on a silicon substrate, the trench memory capacitor can raise its capacity without deteriorating its high packing density. However, the area and the depth of a trench are hard to control when a memory capacitor is more minimized, and thereby causing a a serious manufacturing problem with regard to the yield. Hence, It is desirable to provide a memory capacitor having a higher capacitance while maintaining the same occupation area as that disclosed by the conventional art.

In the respect of photonic devices such as photodetectors, it is needed to increase light absorption per unit area to achieve a higher integration density. Although many methods have been employed to achieve this object including developing a new material system, a simple and effective means should be the one which will significantly enlarge the interfacial area of a P-N junction while maintaining the same occupation area of a photodetector as that disclosed by the conventional art. This invention provides a proposal to meet this requirement.

SUMMARY OF INVENTION

Therefore, an object of the invention is to provide a method of remarkably increasing an interfacial area between neighbor layers of a device while maintaining the same occupation area as that disclosed by the conventional art, thereby ameliorating electrical characteristics of the device. To achieve this object, the present invention provides a rugged stacked oxide layer which comprises a lower layer of a PE TEOS and an upper layer of an $O_3$/TEOS. Taking the advantage of a highly rough surface provided by the rugged stacked oxide layer, a deposition layer subsequently laid over the rugged oxide layer will also produce a very rough surface since the growing of this deposition layer is followed along the topography of the $O_3$/TEOS. Thus, this deposition layer has more interfacial area with any subsequent deposition layer due to the existance of the highly rough surface. Hence, this unique characteristic can be used to form a polysilicon layer storage electrode of a capacitor or to form an epitaxial layer used as P/N junction of a photodetector to ameliorate its electrical chacteristics and provide a higher integration density.

BRIEF DESCRIPTION OF THE DRAWINGS

The invention itself, however, as well as other features and advantages thereof, will be best understood by reference to the detailed description which follows, read in conjunction with the accompanying drawings, wherein.

DESCRIPTION OF THE PREFERRED EMBODIMENT

The motion of present invention is excited by the following experiment which comprises depositing an oxide layer by a plasma enhanced chemical vapor deposition (PECVD) method and then depositing an oxide layer by a method of $O_3$/TEOS, in which an $O_3$ gas is introduced to a vapor of a tetraethoxysilicate (abbreviated TEOS) solution and thus a product of silicon dioxide can be obtained after chemical reactions. In this specification, the term of "$O_3$/TEOS" or "TEOS" is referred to as a final product of an oxide layers rather than a method of forming the final product hereinafter. As a result, a surface of the $O_3$/TEOS is constituted by many island structures which can be proved by a scanning electron microscopic (SEM) Photography later. This result indicates that deposition of a polysilicon storage electrode since the growing of the polysilicon layer is followed along the topography of the $O_3$/TEOS. It is noted that the PE TEOS is laid underneath the $O_3$/TEOS so that the formation of a rugged surface of the $O_3$/TEOS only occurs when the $O_3$/TEOS has a base layer of the PE TEOS and these two oxide layers constitute the so called "rugged stacked oxide layer" in this specification.

Figure 1:
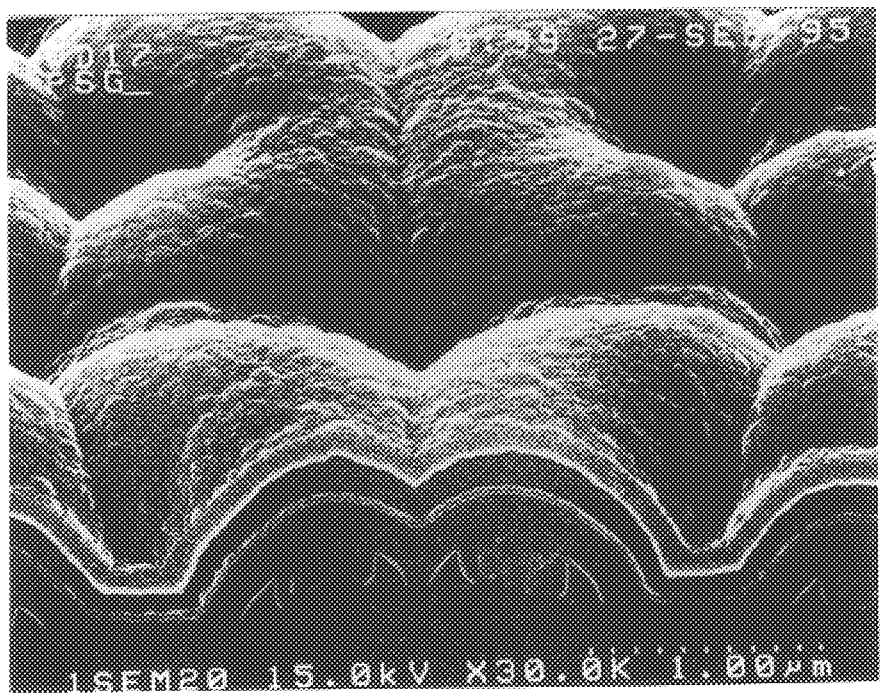
FIG. 1 is a SEM picture of a conventional oxide layer and a polysilicon layer thereon.
Figure 2:
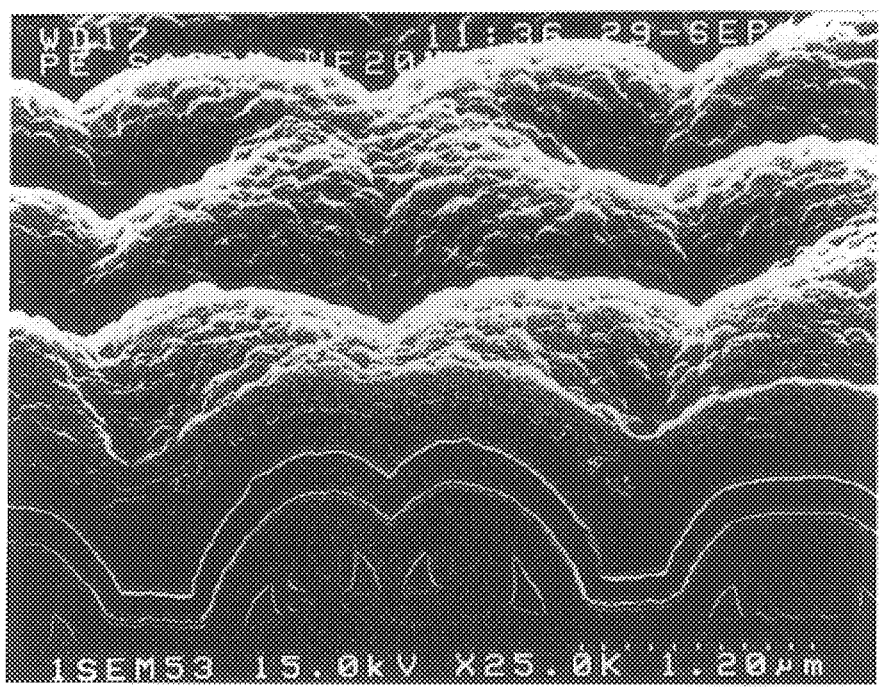
FIG. 2 is a SEM picture of a rugged stacked oxide layer and a polysilicon layer thereon according to the present invention.

In order to verify the above inference, a SEM photograph of a a stacked structure of the rugged stacked oxide layer and the polysilicon layer thereon according to the present invention was shown in FIG. 2 in which the surface of the polysilicon layer (i.e. positioned in the top layer of FIG. 2) is much more corrugated than that of a conventional stacked structure of an oxide layer and a polysilicon layer thereon as shown in FIG. 1 (it is noted that these two photographs have the same magnification). In addition, the same result can be obtained in an interface between the polysilicon layer and the $O_3$/TEOS, which further enlarges the area of the storage electrode by removing the rugged stacked oxide layer and thus making a bottom surface of the storage electrode exposed. A dielectric film such as ONO(Oxide-Nitride-Oxide) is then deposited over the storage electrode. Finally, a memory capacitor is finished after depositing a polysilicon layer over the dielectric film. When the storage electrode described above is incorporated into a capacitor and made available to a DRAM cell, a signal to noise (S/N) ratio of the DRAM cell can be remarkably raised. Compared to the conventional art, the invention provides a memory capacitor having a higher capacitance while maintaining the same occupation area of a memory capacitor as that disclosed by the conventional art, thereby providing a higher integration density.

The rugged stacked oxide layer can be also formed by the following methods, which comprise: 1. a process of depositing the $O_3$/TEOS on a thermal oxide layer; 2. a process of depositing the $O_3$/TEOS on a PSG layer formed by a TEOS method; 3. a process of depositing the $O_3$/TEOS on a nitride layer formed by LPCVD or the PECVD methods. Meanwhile, the best growing conditions of the rugged stacked oxide layer comprise the growing temperature of 300°–500° C., a presure of 200–760 Torr, and a flowing rate of $O_3$ to TEOS in a ratio larger than 8. For the purpose of forming a rough surface, the best growing condition involving a PSG layer formed by a TEOS method comprise a growing temperature of 340°–440° C., a presure of 3–16 Torr, and a power of 300–900 watts.

THE SECOND PREFERRED EMODIMENT

Photodetectors are widely used in an optical fiber communication and their basic structure comprises a P-N diode or a metal-semiconductor diode. The performance of a photodetector which is measured as light absorpted per unit area, is proportional to its interfacial area between the P-N junction or between the metal and semiconductor of a diode. Hence, the P-N diode, fabricated by first depositing said rugged stacked oxide layer and then by depositing a P type and a N type epitaxial layers, can achieve this object. Similarly, the metal-semiconductor diode, fabricated by first depositing said rugged stacked oxide layer and then by depositing a silicon epitaxial layer and a metal layer, can also achieve this object. As proved by experiment results, a photodetector made according to the present invention has more photoexcited electrons than that provided by the conventional art, thereby raising its sensitivity.

Although the preferred embodiments of the invention have been disclosed for illustrative purposes, those skilled in the art will appreciate that various modifications, additions and substitutions are possible, without departing from the scope and spirit of the invention, as disclosed in the accompanying claims.

What is claimed is:

1. A method of fabricating a rugged stacked oxide layer comprising the steps of:

forming a lower layer of PE TEOS on a silicon substrate; and subsequently depositing an upper layer of $O_3$/TEOS on the lower layer of PE TEOS at a temperature between 300°–500° C. to form the rugged stacked oxide layer.

2. A method of fabricating a rugged stacked oxide layer according to claim 1 further comprising the steps of:

depositing a polysilicon layer over the $O_3$/TEOS;

forming a dielectric film; and depositing a polysilicon layer.

3. A method of fabricating a rugged stacked oxide layer according to claim 1 further comprising the step of:

depositing a P type epitaxial layer; and depositing a N type epitaxial layer.

4. A method of fabricating a rugged stacked oxide layer according to claim 2 wherein said rugged stacked oxide layer comprises of a lower layer of thermal oxide and an upper layer of $O_3$/TEOS.

5. A method of fabricating a rugged stacked oxide layer according to claim 2 wherein said rugged stacked oxide layer comprises a lower layer of PSG formed by a TEOS method and an upper layer of $O_3$/TEOS.

6. A method of fabricating a rugged stacked oxide layer according to claim 3 wherein said rugged stacked oxide layer comprises a lower layer of thermal oxide and an upper layer of $O_3$/TEOS.

7. A method of fabricating a rugged stacked oxide layer according to claim 3 wherein said rugged stacked oxide layer comprises a lower layer of PSG formed by a TEOS method and an upper layer of $O_3$/TEOS.

8. A method of fabricating a rugged stacked oxide layer according to claim 3 wherein said rugged stacked oxide layer comprises a lower layer of nitride formed by a LPCVD or a PECVD method and an upper layer of $O_3$/TEOS.

9. A method of fabricating a rugged stacked oxide layer comprising the steps of:

forming a lower layer of nitride on a silicon substrate by a LPCVD or a PECVD method; and subsequently depositing an upper layer of $O_3$/TEOS on the lower layer of nitride at a temperature between 330°–500° C. to form the rugged stacked oxide layer.

10. The method of fabricating a rugged stacked oxide layer according to claim 9 further comprising the steps of:

depositing a polysilicon layer over the $O_3$/TEOS;

forming a dielectric film; and depositing a polysilicon layer.

* * * * *